(12) United States Patent
Zhou et al.

(10) Patent No.: US 11,042,099 B2
(45) Date of Patent: Jun. 22, 2021

(54) PHOTOETCHING APPARATUS AND METHOD (71) Applicant: SHANGHAI MICRO ELECTRONICS EQUIPMENT (GROUP) CO., LTD., Shanghai (CN)

(72) Inventors: Chang Zhou, Shanghai (CN); Zhiyong Yang, Shanghai (CN); Linlin Ma, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 0 days.

(21) Appl. No.: 16/494,120

(22) PCT Filed: Mar. 13, 2018

(86) PCT No.: PCT/CN2018/078829
§ 371 (c)(1),
(2) Date: Sep. 13, 2019

(87) PCT Pub. No.: WO2018/166444
PCT Pub. Date: Sep. 20, 2018

(65) Prior Publication Data
US 2020/0257207 A1 Aug. 13, 2020

(30) Foreign Application Priority Data
Mar. 15, 2017 (CN) .......................... 201710154356.4

(51) Int. Cl.
*G03B 27/42* (2006.01)
*G03F 7/20* (2006.01)
*G03F 9/00* (2006.01)

(52) U.S. Cl.
CPC ...... *G03F 7/70358* (2013.01); *G03F 7/70141* (2013.01); *G03F 7/70725* (2013.01); *G03F 7/70775* (2013.01); *G03F 9/7034* (2013.01)

(58) Field of Classification Search
CPC ............. G03F 7/70358; G03F 7/70216; G03F 7/70066; G03F 7/70275; G03F 7/70791;
(Continued)

(56) References Cited

U.S. PATENT DOCUMENTS 5,729,331 A     3/1998  Tanaka et al.
2005/0264782 A1* 12/2005 Ryzhikov ............ G03F 7/70791
                                                    355/55
(Continued)

FOREIGN PATENT DOCUMENTS

CN     101135859 A     3/2008
CN     101303533 A    11/2008
(Continued)

*Primary Examiner* — Peter B Kim
(74) *Attorney, Agent, or Firm* — Muncy, Geissler, Olds & Lowe, P.C.

(57) ABSTRACT

The lithography apparatus includes at least two exposure devices and one substrate device. The substrate device includes a substrate stage and a substrate supported by the substrate stage. The at least two exposure devices are disposed in symmetry to each other above the substrate with respect to a direction for scanning exposure and configured to simultaneously create two exposure fields onto the substrate to expose the portions of the substrate within the exposure fields.

22 Claims, 2 Drawing Sheets (58) Field of Classification Search
CPC .. G03F 7/70641; G03F 9/7003; G03F 9/7026; G03F 9/7034; G03F 9/7088; G03F 7/70141; G03F 7/70725; G03F 7/70775; G03F 9/7019; G03F 9/7023
See application file for complete search history.

(56) References Cited

U.S. PATENT DOCUMENTS

2006/0250598 A1* 11/2006 Sasaki ................ G03F 7/70341
355/55
2017/0219935 A1* 8/2017 Chen .................... H01L 21/027

FOREIGN PATENT DOCUMENTS

| | | |
|---|---|---|
| CN | 102968000 A | 3/2013 |
| CN | 103197506 A | 7/2013 |
| CN | 104136969 A | 11/2014 |
| CN | 104166312 A | 11/2014 |
| CN | 104412152 A | 3/2015 |
| CN | 105320399 A | 2/2016 |
| CN | 106154759 A | 11/2016 |
| CN | 106154759 A | 11/2016 |
| EP | 0313200 A2 | 4/1989 |
| JP | H01161243 A | 6/1989 |
| JP | H01305520 A | 12/1989 |
| JP | H09306826 A | 11/1997 |
| JP | 2001168003 A | 6/2001 |
| JP | 2001255139 A | 9/2001 |
| JP | 2001296667 A | 10/2001 |
| JP | 2003031461 A | 1/2003 |
| JP | 2003309053 A | 10/2003 |
| JP | 2004347964 A | 12/2004 |
| JP | 2005092137 A | 4/2005 |
| JP | 2013182210 A | 9/2013 |
| JP | 2016024257 A | 2/2016 |
| TW | 201040673 A | 11/2010 |
| TW | 201506551 A | 2/2015 |
| WO | WO-2016045432 A1 * | 3/2016 ........... G03F 9/7034 |

* cited by examiner

PHOTOETCHING APPARATUS AND METHOD

TECHNICAL FIELD

The present disclosure relates to the technical field of lithography machine and, in particular, to a lithography apparatus and method.

BACKGROUND

A scan projection lithography machine is used to project an image of a mask pattern appropriately and clearly onto a substrate coated with photoresist. For large-size substrates, the current practice is to use combined objective lens to provide a large angular field suitable for the large-size substrates. However, the combined objective lens is expensive and may lead to lots of risks in design. Moreover, the combined objective lens is not suitable for some particular applications, such as those with small photomasks and thus requiring small angular fields for exposure.

SUMMARY OF THE DISCLOSURE

An objective of the present disclosure is to provide a lithography apparatus and method suitable for use in exposure for a large substrate with a small angular field for exposure.

To this end, the present disclosure provides a lithography apparatus, comprising two exposure devices and a substrate device;

wherein, the substrate device comprises a substrate stage configured to support a substrate, and the two exposure devices are disposed above the substrate stage in symmetry to each other with respect to a direction for scanning exposure and configured to simultaneously create two exposure fields onto the substrate to expose portions of the substrate within the exposure fields.

Further, each of the two exposure devices comprises an illumination device, a mask stage, an objective lens, alignment devices and a vertical measurement sensor;

wherein the mask stage is configured to support a photomask, the illumination device is disposed above the mask stage, the objective lens is located under the mask stage, the alignment devices and the vertical measurement sensor are both positioned above the substrate stage, the alignment devices are configured to measure a position of the substrate relative to the photomask, and the vertical measurement sensor is configured to measure a surface profile of the substrate.

Further, each of the alignment devices comprise a substrate alignment device and a mask alignment device;

wherein, the substrate alignment device is configured to measure a position of the substrate relative to the substrate stage, the mask alignment device configured to measure a position of the photomask relative to the substrate stage.

Further, the substrate device further comprises a plurality of reference plates, each of the exposure devices corresponds to at least one of the plurality of reference plates, each of the plurality of reference plates is provided with reference marks, and the substrate alignment device and the mask alignment device are configured to measure positions of the marks on a corresponding one of the reference plates to obtain the positions of the substrate and the photomask relative to the substrate stage.

Further, the mask alignment device is disposed under a corresponding one of the reference plates.

Further, the plurality of reference plates comprises two measuring reference plates respectively corresponding to the two exposure devices and a calibrating reference plate located between the two measuring reference plates, and wherein the calibrating reference plate is provided with calibrating marks, and the substrate alignment device and mask alignment device in each of the exposure devices are configured to regularly measure the calibrating marks to calibrate positions of the substrate alignment device and mask alignment device relative to the substrate stage.

Further, the substrate comprises a plurality of substrate alignment marks, and the substrate alignment device is configured to determine the position of the substrate by measuring positions of the substrate alignment marks.

The present disclosure provides a lithography method, using the lithography apparatus of claim 1, the method comprising:

step 1, placing a substrate on a substrate stage and arranging two exposure devices in symmetry to each other above the substrate with respect to a direction for scanning exposure;

step 2, measuring an overall surface profile of the substrate to obtain an adjustment amount for global leveling of the substrate, and performing global leveling to the substrate;

step 3, performing substrate alignment processes simultaneously by substrate alignment devices in each of the exposure devices and calculating a deviation of the substrate based on a positional relationship between the substrate and the substrate stage;

step 4, controlling the substrate stage and/or a mask stage in each of the exposure devices to move to compensate for the deviation of the substrate; and step 5, during exposure for each of exposure fields, measuring, by a vertical measurement sensor in each of the exposure devices, a local surface profile of a portion of the substrate within a corresponding one of the exposure fields in real time, and controlling the mask stage in a corresponding one of the exposure devices to move based on the local surface profile, to make an optimum focal plane for the exposure to coincide with the exposure fields.

Further, step 2 comprises: measuring, by a vertical measurement sensor in each of the exposure devices, a position coordinate $(x_i, y_i, z_i)$ of each measurement point on the substrate, wherein i=1, 2, ..., n and n is a natural number, inputting the position coordinate $(x_i, y_i, z_i)$ of each measurement point to a plane fitting model $z_i = wz - wwy \cdot x_i + wwx \cdot y_i$, to obtain a global fitted surface for the substrate, wherein wz represents a height value of the global fitted surface, wwx represents an X-directional tilt value of the global fitted surface and wwy represents an Y-directional tilt value of the global fitted surface; and determining an adjustment amount for global leveling of the substrate based on a difference between the global fitted surface and an optimum focal plane for alignment for the substrate.

Further, the optimum focal plane for alignment for the substrate is an average of reference focal planes of the objective lenses in the exposure devices.

Further, step 3 comprises:

defining regions of the substrate corresponding to the two exposure devices as a first region and a second region respectively, controlling the substrate stage to move along a direction for scanning, and measuring positions of substrate alignment marks in the first and second regions respectively by the substrate alignment devices in the two exposure devices; and calculating the deviation of the substrate based on measured and nominal positions of the substrate alignment marks in the first region as well as measured and nominal positions of the substrate alignment marks in the second region.

Further, calculating the deviation of the substrate comprises:

calculating an offset (Rz_L, Cx_L, Cy_L) of the first region relative to the substrate stage based on the measured and nominal positions of the substrate alignment marks in the first region according to following equations, and calculating an offset (Rz_R, Cx_R, Cy_R) of the second region relative to the substrate stage based on the measured and nominal positions of the substrate alignment marks in the second region according to the following equations, wherein Rz_L represents a rotational component of the first region about an Z-axis relative to the substrate stage, Cx_L and Cy_L respectively represent X-directional and Y-directional translational components of the first region relative to the substrate stage, Rz_R represents a rotational component of the second region about the Z-axis relative to the substrate stage, and Cx_R and Cy_R respectively represent X-directional and Y-directional translational components of the second region relative to the substrate stage; the equations are as follows:

$$\begin{cases} dx_i = Mx * X_i - (Rz + \text{non\_ortho}) * X_i + Cx \\ dy_i = My * Y_i + Rz * X_i + Cy \end{cases},$$

wherein (Xi, Yi) represents the nominal positions of the substrate alignment marks, $dx_i$ and $dy_i$ respectively represent the differences between the measured and nominal positions of the substrate alignment marks, Mx represents an X-directional magnification of the substrate, My represents a Y-directional magnification of the substrate, and non_ortho represents a non-orthogonal component of the substrate.

Further, compensating for the deviation of the substrate in step 4 comprises:

calculating a rotational adjustment amount dRz about the Z-axis, an X-directional translational adjustment amount dCx and an X-directional translational adjustment amount dCy, for the substrate stage; controlling the substrate stage to move based on the calculated adjustment amounts, to compensate for a common part of the offsets of the first region and second region relative to the substrate stage; wherein:

$$dRz = -\left(\frac{Rz\_L + Rz\_R}{2}\right);$$

$$dCx = -\left(\frac{Cx\_L + Cx\_R}{2}\right);$$

$$dCy = -\left(\frac{Cy\_L + Cy\_R}{2}\right);$$

and then calculating a rotational adjustment amount RS.Rz_L about the Z-axis, an X-directional translational adjustment amount RS.Cx_L and an Y-directional translational adjustment amount RS.Cy_L, for the mask stage corresponding to the first region; calculating a rotational adjustment amount RS.Rz_R about the Z-axis, an X-directional translational adjustment amount RS.Cx_R and an Y-directional translational adjustment amount RS.Cy_R, for the mask stage corresponding to the second region; controlling the mask stages corresponding to the first region and second region to move based on corresponding ones of the adjustment amounts to respectively compensate for remainders of the offsets of the first region and second region relative to the substrate stage; wherein:

$$RS \cdot Rz\_L = -\left(Rz\_L - \frac{Rz\_L + Rz\_R}{2}\right);$$

$$RS \cdot Cx\_L = -\left(Cx\_L - \frac{Cx\_L + Cx\_R}{2}\right);$$

$$RS \cdot Cy\_L = -\left(Cy\_L - \frac{Cy\_L + Cy\_R}{2}\right);$$

$$RS \cdot Rz\_R = -\left(Rz\_R - \frac{Rz\_L + Rz\_R}{2}\right);$$

$$RS \cdot Cx\_R = -\left(Cx\_R - \frac{Cx\_L + Cx\_R}{2}\right);$$

$$RS \cdot Cy\_R = -\left(Cy\_R - \frac{Cy\_L + Cy\_R}{2}\right).$$

Further, compensating for the deviation of the substrate in step 4 comprises:

calculating a rotational adjustment amount RS.Rz_L about the Z-axis, an X-directional translational adjustment amount RS.Cx_L and an Y-directional translational adjustment amount RS.Cy_L, for the mask stage corresponding to the first region; according to the following equations, calculating a rotational adjustment amount RS.Rz_R about the Z-axis, an X-directional translational adjustment amount RS.Cx_R and an Y-directional translational adjustment amount RS.Cy_R, for the mask stage corresponding to the second region; controlling the mask stages corresponding to the first region and second region to move simultaneously based on corresponding ones of the adjustment amounts to respectively compensate for the offsets of the first region and second region relative to the substrate stage; wherein:

RS.Rz_L=−Rz_L;

RS.Cx_L=−Cx_L;

RS.Cy_L=−Cy_L;

RS.Rz_R=−Rz_R;

RS.Cx_R=−Cx_R;

RS.Cy_R=−Cy_R.

Further, step 5 comprises controlling the mask stage to move to compensate for Z-directional height, Rx-directional tilt and Ry-directional tilt for the local surface profile of the portion of the substrate within the corresponding one of the exposure fields, wherein:

controlling the mask stage to move to compensate for Z-directional height comprises:

defining a value $RS.Z_{set\_i}$ for a Z-directional movement of the mask stage at a start point of each of the exposure fields as:

$RS.Z_{set\_i} = RS.Z_{ref\_i} + 1/N^{2*}(FLS.Z_i - BF\_Die.Z) \otimes WSF;$
and defining a value $RS.Z_{set\_i}$ for the Z-directional movement of the mask stage during scanning exposure as:

$RS.Z_{set\_i} = RS.Z_{ref\_i} + 1/N^{2*}(FLS.Z_i - FLS.Z_{i-1}) \otimes WSF,$ wherein, $RS.Z_{ref\_i}$ represents a preset Z-directional value for a movement of the mask stage towards a reference object plane during the scanning exposure; $FLS.Z_i$ represents a Z-directional height value measured out by the vertical measurement sensor in a current sampling cycle; $FLS.Z_{i-1}$ represents a Z-directional height value measured out by the vertical measurement sensor in a previous sampling cycle; $BF\_Die.Z$ represents a Z-directional height value of the optimum focal plane; N represents a magnification of a first objective lens; and WSF represents a filtering parameter;

controlling the mask stage to move to compensate for an Rx-directional tilt value $RS.Rx_{set\_i}$ comprises:

defining an Rx-directional tilt value $RS.RX_{set\_i}$ of the mask stage at the start point of each of the exposure fields as:

$$RS.Rx_{set\_i}=RS.Rx_{ref\_i}+1/N*(FLS.Rx_i-BF\_Die.Rx)\otimes WSF;\text{ and}$$

defining an Rx-directional tilt value $RS.Rx_{set\_i}$ of the mask stage during scanning exposure as:

$$RS.Rx_{set\_i}=RS.Rx_{ref\_i}+1/N*(FLS.Rx_i-FLS.Rx_{i-1})\otimes WSF,$$

wherein, $RSR.Rx_{ref\_i}$ represents a preset Rx-directional tilt value for the movement of the mask stage towards the reference object plane during the scanning exposure; $FLS.Rx_i$ represents an Rx-directional tilt value measured out by the vertical measurement sensor in the current sampling cycle; $FLS.Rx_{i-1}$ represents an Rx-directional tilt value measured out by the vertical measurement sensor in the previous sampling cycle; and $BF\_Die.Rx$ represents an Rx-directional tilt value of the optimum focal plane;

controlling the mask stage to move to compensate for an Ry-directional tilt value $RS.Ry_{set\_i}$ comprises:

defining an Rx-directional tilt value $RS.Ry_{set\_i}$ of the mask stage at the start point of each of the exposure fields as:

$$RS.Ry_{set\_i}=RS.Ry_{ref\_i}+1/N*(FLS.Ry_i-BF\_Die.Ry)\otimes WSF;\text{ and}$$

defining an Ry-directional tilt value $RS.Ry_{set\_i}$ of the mask stage during scanning exposure as:

$$RS.Ry_{set\_i}=RS.Ry_{ref\_i}+1/N*(FLS.Ry_i-FLS.Ry_{i-1})\otimes WSF,$$

wherein, $RS.Ry_{ref\_i}$ represents a preset Ry-directional tilt value for the movement of the mask stage towards the reference object plane during the scanning exposure; $FLS.Ry_i$ represents an Ry-directional tilt value measured out by the vertical measurement sensor in the current sampling cycle; $FLS.Ry_{i-1}$ represents an Ry-directional tilt value measured out by the vertical measurement sensor in the previous sampling cycle; and $BF\_Die.Ry$ represents an Ry-directional tilt value of the optimum focal plane.

Further, step 3 further comprises performing a mask alignment process simultaneously and respectively by a mask alignment device in each of the exposure devices, to obtain a positional relationship between the substrate stage and masks of the exposure devices.

According to the lithography apparatus and method of the present disclosure, the exposure for a large-size substrate can be achieved by providing a plurality of small angular fields arranged in parallel, which reduces the difficulty in designing the combined objective lens. Moreover, the apparatus and method according to the present disclosure are easy to extend for substrate with larger size, reduces the manufacturing cost and improves compatibility between different processes.

BRIEF DESCRIPTION OF THE DRAWINGS

In the figures, 10 denotes a substrate stage; 11 denotes a first illumination device; 12 denotes a second illumination device; 21 denotes a first photomask; 22 denotes a second photomask; 31 denotes a first mask stage; 32 denotes a second mask stage; 41 denotes a first objective lens; 42 denotes a second objective lens; 51 denotes a first substrate alignment device; 52 denotes a second substrate alignment device; 61 denotes a first vertical measurement sensor; 62 denotes a second vertical measurement sensor; 7 denotes a substrate; 81 denotes a first reference plate; 82 denotes a second reference plate; 83 denotes a third reference plate; 91 denotes a first mask alignment device; and 92 denotes a second mask alignment device.

DETAILED DESCRIPTION

The lithography apparatus and method proposed herein will be described in greater detail below with reference to the accompanying drawings and as well as to a few particular embodiments. Features and advantages of the disclosure will become more apparent from the following detailed description, and from the appended claims.

Note that the accompanying drawings are provided in a very simplified form not necessarily presented to scale, and their only intention is to facilitate convenience and clarity in explaining the several disclosed embodiments.

The core concept of the present disclosure is to provide a lithography apparatus and method, which can expose a large-size substrate with parallel small angular fields and address local deformation of the substrate during the exposure.

Following this concept, the present disclosure provides a lithography apparatus, which includes at least two exposure devices and one substrate device, the substrate device including a substrate stage and a substrate supported by the substrate stage, the at least two exposure devices disposed above the substrate in symmetry to each other with respect to a direction for scanning exposure and configured to simultaneously create two exposure fields onto the substrate and expose the portions of the substrate within the exposure fields.

Embodiment 1

Figure 1:
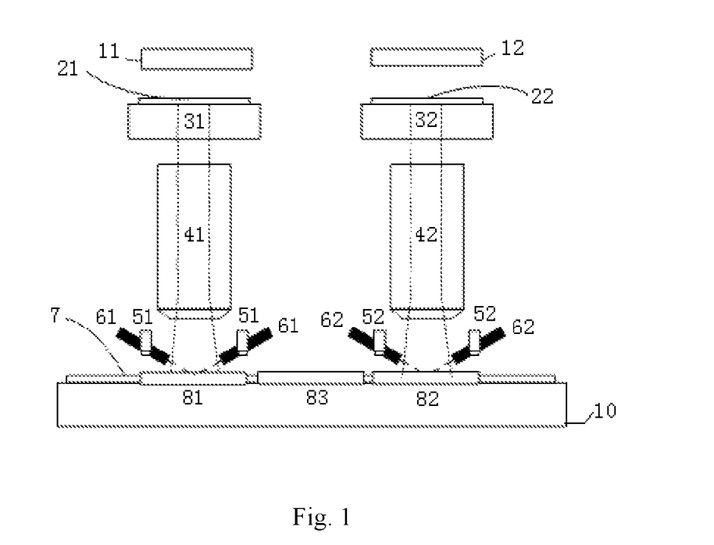
FIG. 1 is a structural schematic of a lithography apparatus according to the present disclosure.
Figure 2:
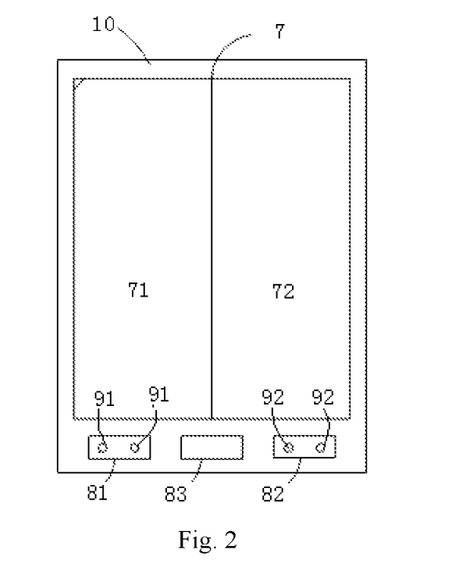
FIG. 2 is a top view of a substrate of the lithography apparatus according to the present disclosure.

A lithography apparatus according to the present embodiment includes two exposure devices which are a first exposure device and a second exposure device. As shown in FIGS. 1 to 2, the substrate device includes a substrate stage 10 and a substrate 7 supported by the substrate stage 10. The substrate 7 includes a first region 71 and a second region 72. The first and second exposure devices are disposed in symmetry to each other with respect to a direction for scanning exposure of the substrate, and correspond to the first region 71 and second region 72, respectively. The first exposure device is configured to measure the first region 71 and adjust parameters of the substrate stage 10 and itself based on the measurement results. The second exposure device is configured to measure the second region 72 and adjust parameters of the substrate stage 10 and itself based on the measurement results. The first and second exposure devices are adapted to simultaneously expose the first region 71 and second region 72, respectively.

The lithography apparatus according to the present embodiment enables flexible adjustment of the parameters of the substrate stage 10 and first and second exposure devices since the first exposure device is configured to measure the first region 71 and adjust the parameters of the substrate stage 10 and the first exposure device itself based on the measurement results and the second exposure device is configured to measure the second region 72 and adjust the parameters of the substrate stage 10 and the second region 72 itself. As such, when local deformations or raises exist in portions of the substrate 7 within the exposure field, the parameters of the first or second exposure device may be accordingly adjusted by the first and second exposure devices to compensate for the defects caused by the local deformations or raises in the portions of the substrate in the corresponding exposure field. Moreover, since the first and second exposure devices simultaneously expose the first region 71 and second region 72 respectively, a large substrate can be exposed with small angular fields in a single step. This can reduce the number of required steps and thus lower the process cost.

Specifically, in the lithography apparatus, the first exposure device includes a first illumination device 11, a first photomask 21, a first mask stage 31, a first objective lens 41, a first substrate alignment device 51, a first vertical measurement sensor 61 and a first mask alignment device 91. The first mask stage 31 holds the first photomask 21, and the first illumination device 11 is disposed above the first photomask 21. The first objective lens 41 is arranged under the first mask stage 31, and the first substrate alignment device 51 and first vertical measurement sensor 61 are both located above the first region 71. The first substrate alignment device 51 is configured to measure a position of the first region 71 relative to the substrate stage 10, and the first vertical measurement sensor 61 is configured to measure a surface profile of the first region 71. The first mask alignment device 91 is configured to measure a position of the first photomask 21 relative to the substrate stage 10. Similarly, in this embodiment, the second exposure device includes a second illumination device 12, a second photomask 22, a second mask stage 32, a second objective lens 42, a second substrate alignment device 52, a second vertical measurement sensor 62 and a second mask alignment device 92.

Therefore, according to this embodiment, since the two exposure devices can expose two different regions of the substrate respectively, the exposure for a large substrate with small angular fields is achieved.

In the lithography apparatus, the substrate device further includes reference plates, and each of the exposure devices corresponds to at least one of the reference plates. Each of the reference plates is provided with reference marks and is in a fixed position relative to the substrate stage 10. According to this embodiment, the reference plates include a first reference plate 81, a second reference plate 82 and a third reference plate 83, each of which is provided with two reference marks. Each of the reference marks may have any conventional structure which is not limited here. Preferably, the reference marks on the first reference plate 81, second reference plate 82 and third reference plate 83 have a same structure. The first substrate alignment device 51 is configured to measure the reference marks of the first reference plate 81 to figure out the position of the first substrate alignment device 51 relative to the substrate stage 10, and the second substrate alignment device 52 is configured to measure the reference marks of the second reference plate 82 to figure out the position of the second substrate alignment device 52 relative to the substrate stage 10.

The third reference plate 83 may be configured for calibration. The reference marks of the third reference plate 83 is configured for use in measuring the position of the first substrate alignment device 51 relative to the second substrate alignment device 52. The first substrate alignment device. 51 is configured to mark its own position by measuring the reference marks on both the first reference plate 81 and third reference plate 83, and the second substrate alignment device 52 is configured to mark its own position by measuring the reference marks of both the second reference plate 82 and third reference plate 83. Since both the first substrate alignment device 51 and the second substrate alignment device 52 are in positional relation with the reference marks on the third reference plate 83, the position of the first substrate alignment device 51 relative to the second substrate alignment device 52 can be determined.

As can be seen from FIGS. 1 and 2, the first reference plate 81, second reference plate 82 and third reference plate 83 are positioned on the substrate stage 10 at a region which is close to edges of one side of the substrate stage 10 and where the substrate 7 is not placed. The first reference plate 81 and second reference plate 82 correspond to the first region 71 and second region 72 respectively, whilst the third reference plate 83 corresponds to central portions of the first and second regions 71, 72. In other words, the third reference plate 83 is arranged between the first reference plates 81 and second reference plate 82. The positions of both the first substrate alignment device 51 and second substrate alignment device 52 relative to the substrate stage 10 can be calibrated by measuring the reference marks of the third reference plate 83 regularly.

The first mask alignment device 91 is disposed under the first reference plate 81 and configured to measure positions of marks of the first photomask 21 relative to the reference marks on the first reference plate 81, in order to figure out the position of the first photomask 21 relative to the substrate stage 10. The second mask alignment device 92 is disposed under the second reference plate 82 and configured to measure positions of marks of the second photomask 22 relative to the reference marks of the second reference plate 82, in order to figure out the position of the second photomask 22 relative to the substrate stage 10, as shown in FIG. 2. Those skilled in the art will appreciate that the marks of the photomasks should structurally match the reference marks on the respective reference plates, in order to enable alignment therebetween. Since the marks for alignment can be accomplished in a manner well-known in the art, a detailed description thereof will be omitted here.

Figure 3:
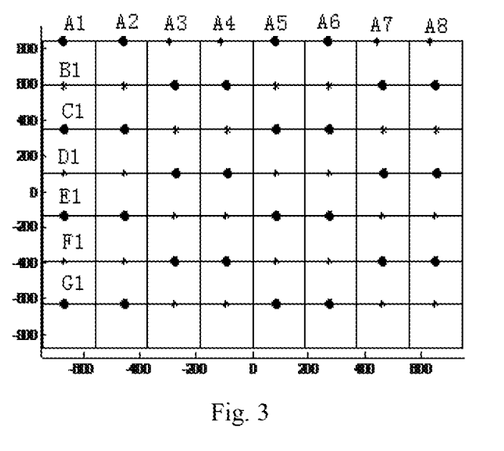
FIG. 3 is a schematic illustration of alignment marks on the substrate according to the present disclosure.

Further, as shown in FIG. 3, in the lithography apparatus, the substrate 7 is provided with a plurality of substrate alignment marks, including, for example, as shown, A1-A8 in a first row, B1-B8 in a second row, C1-C8 in a third row, as well as D1-D8, E1-E8, F1-F8 and G1-G8 in other individual rows. For the sake of simplicity and clarity, only A1-A8 and B1-G1 are labeled, and the positions of the other marks can be readily understood based on those of the labeled ones. The first substrate alignment device 51 is configured to measure the substrate alignment marks on the first region 71, and the second substrate alignment device 52 is configured to measure the substrate alignment marks on the second region 72. Based on the measurement results, the positions of the first region 71 and second region 72 relative to the first reference plate 81 and second reference plate 82 can be figured out, and thus to obtain the positional relationship between the substrate 7 and the substrate stage 10.

While a configuration of the lithography apparatus according to this embodiment has been described in detail above, other configurations are still available without departing from the scope of the disclosure. It is intended that any modification to the above-described configuration, made by those of ordinary skill in the art in light of the teachings hereinabove, falls within the scope of the disclosure.

In this embodiment, a photolithography method is also provided, which includes the following steps.

Step 1, placing the substrate 7 onto the substrate stage 10, and arranging the first exposure device and second exposure device in symmetry to each other above the substrate with respect to a direction for scanning exposure and in correspondence with the first region 71 and second region 72, respectively.

Step 2, measuring the first region 71 by the first vertical measurement sensor 61 in the first exposure device, measuring the second region 72 by the second vertical measurement sensor 62 in the second exposure device measures, and putting the position coordinate $(x_i, y_i, z_i)$ of all the measurement points to the plane fitting model $z_i = wz - wwy \cdot x_i + wwx \cdot y_i$, to obtain a position coordinate of a globally fitted surface for the substrate 7, wherein wz represents a height value (i.e., Z-directional value) of the globally fitted surface, wwx represents a tilt value of the globally fitted surface relative to the X-axis, and wwy represents a tilt value of the globally fitted surface relative to the Y-axis. Based on a difference between the globally fitted surface and an optimum focal plane for the alignment for the substrate 7, determining an amount of adjustment for global leveling of the substrate, to make the surface of the substrate 7 which has been globally leveled to substantially coincide with the optimum focal plane for alignment for the substrate.

Further, the optimum focal plane for alignment for the substrate is an average of reference focal planes of the objective lenses 41, 42 respectively in the first and second exposure devices.

Step 3, performing an alignment process to the substrate simultaneously and respectively by the first substrate alignment device 51 in the first exposure device and the second substrate alignment device 52 in the second exposure device, so as to obtain the positional relationship between the substrate 7 and the substrate stage 10, and calculating the deviation of the substrate 7 based on the above positional relationship.

Specifically, step 3 may include: controlling the substrate stage 10 to move along the scanning direction, at the same time, measuring the substrate alignment marks on the first region 71 by the first substrate alignment device 51 and measuring the substrate alignment marks on the second region 72 by the second substrate alignment device 52.

Subsequently, an offset (Rz_L, Cx_L, Cy_L) of the first region 71 relative to the substrate stage 10 can be figured out based on the measured and nominal positions of the substrate alignment marks on the first region 71 according to the following Equation (1), and an offset (Rz_R, Cx_R, Cy_R) of the second region 72 relative to the substrate stage 10 can be figured out based on the measured and nominal positions of the substrate alignment marks on the second region 72 according to the following Equation (1), wherein, Rz_L represents a rotational component of the first region 71 (shown in the left region in the figure) about the Z-axis relative to the substrate stage 10; Cx_L and Cy_L respectively represent X-directional and Y-directional translational components of the first region 71 relative to the substrate stage 10; Rz_R represents a rotational component of the second region 72 (shown in the right region in the figure) about the Z-axis relative to the substrate stage 10; and Cx_R and Cy_R respectively represent X-directional and Y-directional translational components of the second region 72 relative to the substrate stage 10.

$$\begin{cases} dx_i = Mx * X_i - (Rz + \text{non\_ortho}) * X_i + Cx \\ dy_i = My * Y_i + Rz * X_i + Cy \end{cases} \quad (1)$$

where, $(X_i, Y_i)$ represents the nominal positions of the substrate alignment marks; $dx_i$ and $dy_i$ respectively represent X-directional and Y-directional positional deviations of the substrate alignment marks, i.e., the differences between their measured positions (which is $x_i$ obtained in step 1) and nominal positions $X_i$; Mx represents an X-directional magnification of the substrate; My represents a Y-directional magnification of the substrate; non_ortho represents a non-orthogonal component of the substrate. For calculating the offset of the first region 71 relative to the substrate stage 10, Rz_L, Cx_L, Cy_L is respectively same as Rz, Cx, Cy calculated from the measured and nominal positions of the substrate alignment marks on the first region 71 as well as the magnifications of the first objective lens 41 according to Equation (1). Similarly, for calculating the offset of the second region 72 relative to the substrate stage 10, Rz_R, Cx_R, Cy_R is respectively same as Rz, Cx, Cy calculated from the measured and nominal positions of the substrate alignment marks on the second region 72 as well as the magnifications of the second objective lens 42 according to Equation (1).

Step 3 further includes obtaining the positional relationship between the first photomask 21 in the first exposure device and the substrate stage 10 and the positional relationship of the second photomask 22 in the second exposure device and the substrate stage 10 by simultaneously performing photomask alignment processes respectively by the first mask alignment device 91 in the first exposure device and the second mask alignment device 92 in the second exposure device.

Step 4, controlling the substrate stage 10, first mask stage 31 and second mask stage 32 to move to compensate for the deviation of the substrate 7.

Specifically, a rotational adjustment amount dRz about the Z-axis, an X-directional translational adjustment amount dCx and a Y-directional translational adjustment amount dCy, for the substrate stage 10, are first calculated according to the following equations, and the substrate stage 10 is then controlled to move based on the calculated adjustment amounts so as to compensate for a common part of the offsets of the first region 71 and second region 72 relative to the substrate stage 10:

$$dRz = -\left(\frac{Rz\_L + Rz\_R}{2}\right);$$

$$dCx = -\left(\frac{Cx\_L + Cx\_R}{2}\right);$$

$$dCy = -\left(\frac{Cy\_L + Cy\_R}{2}\right).$$

After that, a rotational adjustment amount RS.Rz_L about the Z-axis, an X-directional translational adjustment amount RS.Cx_L and a Y-directional translational adjustment amount RS.Cy_L, for the first mask stage 31 corresponding to the first region 71, as well as a rotational adjustment amount RS.Rz_R about the Z-axis, an X-directional translational adjustment amount RS.Cx_R and a Y-directional translational adjustment amount RS.Cy_R, for the second mask stage 3 corresponding to the second region 72 are calculated according to the following equations, based on which, the first mask stage 31 and second mask stages 32 are controlled to move to respectively compensate for the remainders of the offsets of the first region 71 and second region 72 relative to the substrate stage 10:

$$RS \cdot Rz\_L = -\left(Rz\_L - \frac{Rz\_L + Rz\_R}{2}\right);$$

$$RS \cdot Cx\_L = -\left(Cx\_L - \frac{Cx\_L + Cx\_R}{2}\right);$$

$$RS \cdot Cy\_L = -\left(Cy\_L - \frac{Cy\_L + Cy\_R}{2}\right);$$

$$RS \cdot Rz\_R = -\left(Rz\_R - \frac{Rz\_L + Rz\_R}{2}\right);$$

$$RS \cdot Cx\_R = -\left(Cx\_R - \frac{Cx\_L + Cx\_R}{2}\right);$$

$$RS \cdot Cy\_R = -\left(Cy\_R - \frac{Cy\_L + Cy\_R}{2}\right).$$

In other words, in step 4, the common part of the offsets of the first region 71 and second region 72 relative to the substrate stage 10 is compensated for by adjusting the position of the substrate stage 10, and the remainders of the offsets are compensated for by adjusting the respective mask stages.

Step 5, during the exposure for each of the exposure fields, by the vertical measurement sensor 61 in the first exposure device, measuring in real time a local surface profile of the first region 71 within a corresponding one of the exposure fields (i.e., a surface profile of the portion of the first region 71 within the corresponding one of the exposure fields), and controlling the first mask stage 31 to move based on the measured local surface profile of the first region 71, to make the optimum focal plane for the first exposure device to substantially coincide with the exposure field corresponding to the first region. At same time, by the vertical measurement sensor 62 in the second exposure device, measuring in real time a local surface profile of the second region 72 within a corresponding one of the exposure fields (i.e., a surface profile of the portion of the second region 72 within the corresponding one of the exposure fields), and controlling the second mask stage 32 to move based on the measured local surface profile of the second region 72, to make the optimum focal plane for the second exposure device to substantially coincide with the exposure field on the second region.

An example in which the first mask stage 31 is controlled to move to compensate for the Z-directional height, Rx-directional tilt and Ry-directional tilt for a local surface profile of the first region within the corresponding one of the exposure fields is described in detail as follows.

Controlling the first mask stage 31 to move to compensate for the Z-directional height for a local surface profile of the first region within the corresponding one of the exposure fields may include:

(S1) defining a value $RS.Z_{set\_i}$ for the Z-directional movement of the first mask stage 31 at the start point of each of the exposure fields as:

$$RS.Z_{set\_i} = RS.Z_{ref\_i} + 1/N^{2*}(FLS.Z_i - BF\_Die.Z) \otimes WSF;$$

and (S2) defining a value $RS.Z_{set\_i}$ for the Z-directional movement of the first mask stage 31 during scanning exposure as:

$$RS.Z_{set\_i} = RS.Z_{ref\_i} + 1/N^{2*}(FLS.Z_i - FLS.Z_{i-1}) \otimes WSF,$$

wherein, $RS.Z_{ref\_i}$ represents a preset Z-directional value for the movement of the first mask stage 31 towards a reference object plane during the scanning exposure; $FLS.Z_i$ represents a Z-directional height value measured out by the vertical measurement sensor 61 in the current sampling cycle; $FLS.Z_{i-1}$ represents a Z-directional height value measured out by the vertical measurement sensor 61 in the previous sampling cycle; BF_Die.Z represents a Z-directional height value of the optimum focal plane; N represents the magnification of the first objective lens 41; and WSF represents a filtering parameter. The filtering may be implemented as low-pass filtering in order to address the problem of insufficient bandwidth for the server for the mask stage. Since the selection of an appropriate filtering process and the setting of the parameter WSF are well-known in the art, a further description thereof is thus omitted here.

Controlling the first mask stage 31 to move to compensate for the Rx-directional tilt value $RS.Rx_{set\_i}$ for a local surface profile of the first region within the corresponding one of the exposure fields may include:

(K1) defining an Rx-directional tilt value $RS.Rx_{set\_i}$ of the first mask stage 31 at the start point of each of the exposure fields as:

$$RS.Rx_{set\_i} = RS.Rx_{ref\_i} + 1/N^{*}(FLS.Rx_i - BF\_Die.Rx) \otimes WSF;$$ and (K2) defining an Rx-directional tilt value $RS.Rx_{set\_i}$ of the first mask stage 31 during scanning exposure as:

$$RS.Rx_{set\_i} = RS.Rx_{ref\_i} + 1/N^{*}(FLS.Rx_i - FLS.Rx_{i-1}) \otimes WSF$$

wherein, $RS.Rx_{ref\_i}$ represents a preset Rx-directional tilt value for the movement of the mask stage towards the reference object plane during the scanning exposure; $FLS.Rx_i$ represents a Rx-directional tilt value measured out by the vertical measurement sensor in the current sampling cycle; $FLS.Rx_{i-1}$ represents an Rx-directional tilt value measured out by the vertical measurement sensor in previous sampling cycle; and BF_Die.Rx represents an Rx-directional tilt value of the optimum focal plane.

Similar to the above, controlling the first mask stage 31 to move to compensate for the Ry-directional tilt value $RS.Ry_{set\_i}$ for a local surface profile of the first region within the corresponding one of the exposure fields may include:

(K1') defining an Rx-directional tilt value $RS.Ry_{set\_i}$ of the first mask stage 31 at the start point of each of the exposure fields as:

$$RS.Ry_{set\_i} = RS.Ry_{ref\_i} + 1/N^{*}(FLS.Ry_i - BF\_Die.Ry) \otimes WSF;$$ and (K2') defining an Ry-directional tilt value $RS.Ry_{set\_i}$ of the first mask stage 31 during scanning exposure as:

$$RS.Ry_{set\_i} = RS.Ry_{ref\_i} + 1/N^{*}(FLS.Ry_i - FLS.Ry_{i-1}) \otimes WSF,$$

wherein, $RS.Ry_{ref\_i}$ represents a preset Ry-directional tilt value for the movement of the mask stage towards the reference object plane during the scanning exposure; $FLS.Ry_i$ represents a Ry-directional tilt value measured out by the vertical measurement sensor in the current sampling cycle; $FLS.Ry_{i-1}$ represents an Ry-directional tilt value measured out by the vertical measurement sensor in previous sampling cycle; and BF_Die.Ry represents an Ry-directional tilt value of the optimum focal plane.

Since the second mask stage 32 is controlled in the same way as the first mask stage 31, a detailed description thereof is thus omitted here.

For more details in vertical control of the photomask stage, reference can be made to Chinese Patent Application No. 201710154051.3, also by the present inventors, entitled "Method for Vertical Control of Lithography Machine", which is incorporated herein in its entirety by reference.

Embodiment 2

This embodiment differs from Embodiment 1 in that the deviation of the substrate 7 is compensated for in step 4 in a different manner. According to the present embodiment, the offsets of the first region 71 and second region 72 relative to the substrate stage 10 are compensated for only by means of controlled movement of the first mask stage 31 and second mask stages 32.

Specifically, the rotational adjustment amount RS.Rz_L about the Z-axis, X-directional translational adjustment amount RS.Cx_L and Y-directional translational adjustment amount RS.Cy_L for the first mask stage 31 and the rotational adjustment amount RS.Rz_R about the Z-axis, X-directional translational adjustment amount RS.Cx_R and Y-directional translational adjustment amount RS.Cy_R for the second mask stage 32 are calculated according to the following set of equations, and the first mask stage 31 and second mask stage 32 are controlled to move based on the corresponding adjustment amount to respectively compensate for the offsets of the first region 71 and second region 72 relative to the substrate stage 10:

RS.Rz_L=−Rz_L;

RS.Cx_L=−Cx_L;

RS.Cy_L=−Cy_L;

RS.Rz_R=−Rz_R;

RS.Cx_R=−Cx_R;

RS.Cy_R=−Cy_R.

Presented above are merely several preferred embodiments of the present disclosure, which are not intended to limit the scope of the disclosure in any way. Any changes and modifications made by those skilled in the art based on the above teachings are intended to fall within the scope as defined by the appended claims.

What is claimed is:

1. A lithography apparatus, comprising two exposure devices and a substrate device;
wherein, the substrate device comprises:
a substrate stage configured to support a substrate; and
a calibrating reference plate,
the two exposure devices are disposed above the substrate stage in symmetry to each other with respect to a direction for scanning exposure and configured to simultaneously create two exposure fields onto the substrate to expose portions of the substrate within the exposure fields;
each of the two exposure devices comprises a substrate alignment device configured to measure a position of the substrate relative to the substrate stage;
the substrate alignment device in each of the exposure devices is further configured to measure the calibrating reference plate to calibrate positions of the substrate alignment device in each of the exposure devices relative to the substrate stage.

2. The lithography apparatus of claim 1, wherein each of the two exposure devices further comprises an illumination device, a mask stage, an objective lens, a mask alignment device and a vertical measurement sensor;
wherein, the mask stage is configured to support a photomask, the illumination device is disposed above the mask stage, the objective lens is located under the mask stage, the substrate alignment device and the vertical measurement sensor are both positioned above the substrate stage, the mask alignment device is configured to measure a position of the photomask relative to the substrate stage, the substrate alignment device and the mask alignment device are configured to measure a position of the substrate relative to the photomask, and the vertical measurement sensor is configured to measure a surface profile of the substrate.

3. The lithography apparatus of claim 2, wherein the substrate device further comprises a plurality of reference plates, each of the exposure devices corresponds to at least one of the plurality of reference plates, each of the plurality of reference plates is provided with reference marks, and the substrate alignment device and the mask alignment device are configured to measure positions of the marks on a corresponding one of the reference plates to obtain the positions of the substrate and the photomask relative to the substrate stage.

4. The lithography apparatus of claim 3, wherein the mask alignment device is disposed under a corresponding one of the reference plates.

5. The lithography apparatus of claim 3, wherein the plurality of reference plates comprises two measuring reference plates respectively corresponding to the two exposure devices and the calibrating reference plate is located between the two measuring reference plates, and wherein the calibrating reference plate is provided with calibrating marks, and the substrate alignment device and mask alignment device in each of the exposure devices are configured to regularly measure the calibrating marks to calibrate positions of the substrate alignment device and mask alignment device relative to the substrate stage.

6. The lithography apparatus of claim 2, wherein the substrate comprises a plurality of substrate alignment marks, and the substrate alignment device is configured to determine the position of the substrate by measuring positions of the substrate alignment marks.

7. A lithography method using the lithography apparatus of claim 1, comprising:
step 1, placing a substrate on a substrate stage and arranging two exposure devices in symmetry to each other above the substrate with respect to a direction for scanning exposure;
step 2, performing substrate alignment processes respectively by substrate alignment devices in each of the exposure devices and calculating a deviation of the substrate based on a positional relationship between the substrate and the substrate stage;
step 3, controlling the substrate stage and/or a mask stage in each of the exposure devices to move to compensate for the deviation of the substrate.

8. The lithography method of claim 7, wherein step 2 comprises:
defining regions of the substrate corresponding to the two exposure devices as a first region and a second region respectively, controlling the substrate stage to move along a direction for scanning, and measuring positions of substrate alignment marks in the first and second regions respectively by the substrate alignment devices in the two exposure devices; and
calculating the deviation of the substrate based on measured and nominal positions of the substrate alignment marks in the first region as well as measured and nominal positions of the substrate alignment marks in the second region.

9. The lithography method of claim 8, wherein calculating the deviation of the substrate comprises:
calculating an offset (Rz_L, Cx_L, Cy_L) of the first region relative to the substrate stage based on the measured and nominal positions of the substrate alignment marks in the first region according to following equations, and calculating an offset (Rz_R, Cx_R, Cy_R) of the second region relative to the substrate stage based on the measured and nominal positions of the substrate alignment marks in the second region according to the following equations, wherein Rz_L represents a rotational component of the first region about an Z-axis relative to the substrate stage, Cx_L and Cy_L respectively represent X-directional and Y-directional translational components of the first region relative to the substrate stage, Rz_R represents a rotational component of the second region about the Z-axis relative to the substrate stage, and Cx_R and Cy_R respectively represent X-directional and Y-directional translational components of the second region relative to the substrate stage; the equations are as follows:

$$\begin{cases} dx_i = Mx*X_i - (Rz + \text{non\_ortho})*X_i + Cx \\ dy_i = My*Y_i + Rz*X_i + Cy \end{cases},$$

wherein (Xi, Yi) represents the nominal positions of the substrate alignment marks, $dx_i$ and $dy_i$, respectively represent the differences between the measured and nominal positions of the substrate alignment marks, Mx represents an X-directional magnification of the substrate, My represents a Y-directional magnification of the substrate, and non_ortho represents a non-orthogonal component of the substrate.

10. The lithography method of claim 9, wherein compensating for the deviation of the substrate in step 4 comprises:
calculating a rotational adjustment amount dRz about the Z-axis, an X-directional translational adjustment amount dCx and an X-directional translational adjustment amount dCy for the substrate stage; controlling the substrate stage to move based on the calculated adjustment amounts, to compensate for a common part of the offsets of the first region and second region relative to the substrate stage; wherein:

$$dRz = -\left(\frac{Rz\_L + Rz\_R}{2}\right);$$

$$dCx = -\left(\frac{Cx\_L + Cx\_R}{2}\right);$$

$$dCy = -\left(\frac{Cy\_L + Cy\_R}{2}\right);$$

and then calculating a rotational adjustment amount RS.Rz_L about the Z-axis, an X-directional translational adjustment amount RS.Cx_L and an Y-directional translational adjustment amount RS.Cy_L, for the mask stage corresponding to the first region; calculating a rotational adjustment amount RS.Rz_R about the Z-axis, an X-directional translational adjustment amount RS.Cx_R and an Y-directional translational adjustment amount RS.Cy_R, for the mask stage corresponding to the second region; controlling the mask stages corresponding to the first region and second region to move based on corresponding ones of the adjustment amounts to respectively compensate for remainders of the offsets of the first region and second region relative to the substrate stage; wherein:

$$RS \cdot Rz\_L = -\left(Rz\_L - \frac{Rz\_L + Rz\_R}{2}\right);$$

$$RS \cdot Cx\_L = -\left(Cx\_L - \frac{Cx\_L + Cx\_R}{2}\right);$$

$$RS \cdot Cy\_L = -\left(Cy\_L - \frac{Cy\_L + Cy\_R}{2}\right);$$

$$RS \cdot Rz\_R = -\left(Rz\_R - \frac{Rz\_L + Rz\_R}{2}\right);$$

$$RS \cdot Cx\_R = -\left(Cx\_R - \frac{Cx\_L + Cx\_R}{2}\right);$$

$$RS \cdot Cy\_R = -\left(Cy\_R - \frac{Cy\_L + Cy\_R}{2}\right).$$

11. The lithography method of claim 9, wherein compensating for the deviation of the substrate in step 4 comprises:
calculating a rotational adjustment amount RS.Rz_L about the Z-axis, an X-directional translational adjustment amount RS.Cx_L and an Y-directional translational adjustment amount RS.Cy_L, for the mask stage corresponding to the first region; according to the following equations, calculating a rotational adjustment amount RS.Rz_R about the Z-axis, an X-directional translational adjustment amount RS.Cx_R and an Y-directional translational adjustment amount RS.Cy_R, for the mask stage corresponding to the second region; respectively controlling the mask stages corresponding to the first region and second region to move based on corresponding ones of the adjustment amounts to respectively compensate for the offsets of the first region and second region relative to the substrate stage; wherein:

RS.Rz_L=−Rz_L;

RS.Cx_L=−Cx_L;

RS.Cy_L=−Cy_L;

RS.Rz_R=−Rz_R;

RS.Cx_R=−Cx_R;

RS.Cy_R=−Cy_R.

12. The lithography method of claim 8, wherein the substrate device further comprises a plurality of reference plates, each of the exposure devices corresponds to at least one of the plurality of reference plates, and the substrate alignment device is configured to measure positions of marks on a corresponding one of the reference plates to obtain a position of the substrate relative to the substrate stage.

13. The lithography method of claim 12, wherein each of the exposure devices further comprises a mask alignment device configured to measure a position of the photomask relative to the substrate stage; step 2 further comprises performing a mask alignment process respectively by a mask alignment device in each of the exposure devices, to obtain a positional relationship between the substrate stage and photomasks of the exposure devices, wherein the mask alignment device is configured to measure positions of marks on a corresponding one of the reference plates to obtain a position of the photomasks relative to the substrate stage.

14. The lithography method of claim 7, wherein each of the exposure devices further comprises a vertical measurement sensor above the substrate stage, wherein the vertical measurement sensor is configured to measure a surface profile of the substrate; a step a is further included between the steps 1 and 2, the step a comprising measuring an overall surface profile of the substrate by the exposure devices to obtain an adjustment amount for global leveling of the substrate, and performing global leveling to the substrate.

15. The lithography method of claim 14, wherein step a comprises: measuring, by a vertical measurement sensor in each of the exposure devices, a position coordinate $(x_i, y_i, z_i)$ of each measurement point on the substrate, wherein i=1, 2, . . . , n and n is a natural number, inputting the position coordinate $(x_i, y_i, z_i)$ of each measurement point to a plane fitting model $z_i = wz - wwy \cdot x_i + wwx \cdot y_i$, to obtain a global fitted surface for the substrate, wherein wz represents a height value of the global fitted surface, wwx represents an X-directional tilt value of the global fitted surface and wwy represents an Y-directional tilt value of the global fitted surface; and determining an adjustment amount for global leveling of the substrate based on a difference between the global fitted surface and an optimum focal plane for alignment for the substrate.

16. The lithography method of claim 15, wherein each of the exposure devices further comprises an objective lens, and the optimum focal plane for alignment for the substrate is an average of reference focal planes of the objective lenses in the exposure devices.

17. The lithography method of claim 7, wherein each of the exposure devices further comprises a vertical measurement sensor above the substrate stage, wherein the vertical measurement sensor is configured to measure a surface profile of the substrate; a step 4 is further included after step 3, the step 4 comprising performing exposure, wherein during exposure for each of exposure fields, a vertical measurement sensor in each of the exposure devices measures a local surface profile of a portion of the substrate within a corresponding one of the exposure fields in real time, and the mask stage in a corresponding one of the exposure devices is controlled to move based on the local surface profile, to make an optimum focal plane for the exposure to coincide with the exposure fields.

18. The lithography method of claim 17, wherein step 4 comprises controlling the mask stage to move to compensate for Z-directional height, Rx-directional tilt and Ry-directional tilt for the local surface profile of the portion of the substrate within the corresponding one of the exposure fields, wherein:

controlling the mask stage to move to compensate for Z-directional height comprises:

defining a value $RS.Z_{set\_i}$ for a Z-directional movement of the mask stage at a start point of each of the exposure fields as:

$$RS.Z_{set\_i} = RS.Z_{ref\_i} + 1/N^{2} * (FLS.Z_i - BF\_Die.Z) \otimes WSF;$$

and defining a value $RS.Z_{set\_i}$ for the Z-directional movement of the mask stage during scanning exposure as:

$$RS.Z_{set\_i} = RS.Z_{ref\_i} + 1/N^{2} * (FLS.Z_i - FLS.Z_{i-1}) \otimes WSF,$$

wherein, $RS.Z_{ref\_i}$ represents a preset Z-directional value for a movement of the mask stage towards a reference object plane during the scanning exposure; $FLS.Z_i$ represents a Z-directional height value measured out by the vertical measurement sensor in a current sampling cycle; $FLS.Z_{i-1}$ represents a Z-directional height value measured out by the vertical measurement sensor in a previous sampling cycle; $BF\_Die.Z$ represents a Z-directional height value of the optimum focal plane; N represents a magnification of a first objective lens; and WSF represents a filtering parameter;

controlling the mask stage to move to compensate for an Rx-directional tilt value $RS.Rx_{set\_i}$ comprises:

defining an Rx-directional tilt value $RS.Rx_{set\_i}$ of the mask stage at the start point of each of the exposure fields as:

$$RS.Rx_{set\_i} = RS.Rx_{ref\_i} + 1/N * (FLS.Rx_i - BF\_Die.Rx) \otimes WSF; \text{ and}$$

defining an Rx-directional tilt value $RS.Rx_{set\_i}$ of the mask stage during scanning exposure as:

$$RS.Rx_{set\_i} = RS.Rx_{ref\_i} + 1/N * (FLS.Rx_i - FLS.Rx_{i-1}) \otimes WSF,$$

wherein, $RS.Rx_{ref\_i}$ represents a preset Rx-directional tilt value for the movement of the mask stage towards the reference object plane during the scanning exposure; $FLS.Rx_i$ represents an Rx-directional tilt value measured out by the vertical measurement sensor in the current sampling cycle; $FLS.Rx_{i-1}$ represents an Rx-directional tilt value measured out by the vertical measurement sensor in the previous sampling cycle; and $BF\_Die.Rx$ represents an Rx-directional tilt value of the optimum focal plane;

controlling the mask stage to move to compensate for an Ry-directional tilt value $RS.Ry_{set\_i}$ comprises:

defining an Rx-directional tilt value $RS.Ry_{set\_i}$ of the mask stage at the start point of each of the exposure fields as:

$$RS.Ry_{set\_i} = RS.Ry_{ref\_i} + 1/N * (FLS.Ry_i - BF\_Die.Ry) \otimes WSF; \text{ and}$$

defining an Ry-directional tilt value $RS.Ry_{set\_i}$ of the mask stage during scanning exposure as:

$$RS.Ry_{set\_i} = RS.Ry_{ref\_i} + 1/N * (FLS.Ry_i - FLS.Ry_{i-1}) \otimes WSF,$$

wherein, $RS.Ry_{ref\_i}$ represents a preset Ry-directional tilt value for the movement of the mask stage towards the reference object plane during the scanning exposure; $FLS.Ry_i$ represents an Ry-directional tilt value measured out by the vertical measurement sensor in the current sampling cycle; $FLS.Ry_{i-1}$ represents an Ry-directional tilt value measured out by the vertical measurement sensor in the previous sampling cycle; and $BF\_Die.Ry$ represents an Ry-directional tilt value of the optimum focal plane.

19. A lithography method using the lithography apparatus of claim 1, comprising:
　　step 1, placing a substrate on a substrate stage and arranging two exposure devices in symmetry to each other above the substrate with respect to a direction for scanning exposure, wherein each of the exposure devices further comprises a mask stage and a vertical measurement sensor, wherein the mask stage is configured to support a photomask, the vertical measurement sensor is above the substrate stage, and the vertical measurement sensor is configured to measure a surface profile of the substrate;
　　step 2, measuring an overall surface profile of the substrate to obtain an adjustment amount for global leveling of the substrate, and performing global leveling to the substrate;
　　step 3, performing exposure, wherein during exposure for each of exposure fields, a vertical measurement sensor in each of the exposure devices measures a local surface profile of a portion of the substrate within a corresponding one of the exposure fields in real time, and the mask stage in a corresponding one of the exposure devices is controlled to move based on the local surface profile, to make an optimum focal plane for the exposure to coincide with the exposure fields.

20. The lithography method of claim 19, wherein step 2 comprises: measuring, by a vertical measurement sensor in each of the exposure devices, a position coordinate $(x_i, y_i, z_i)$ of each measurement point on the substrate, wherein i=1, 2, . . . , n and n is a natural number, inputting the position coordinate $(x_i, y_i, z_i)$ of each measurement point to a plane fitting model $z_i = wz - wwy \cdot x_i + wwx \cdot y_i$, to obtain a global fitted surface for the substrate, wherein wz represents a height value of the global fitted surface, wwx represents an X-directional tilt value of the global fitted surface and wwy represents an Y-directional tilt value of the global fitted surface; and determining an adjustment amount for global leveling of the substrate based on a difference between the global fitted surface and an optimum focal plane for alignment for the substrate.

21. The lithography method of claim 20, wherein each of the exposure device further comprises an objective lens, and the optimum focal plane for alignment for the substrate is an average of reference focal planes of the objective lenses in the exposure devices.

22. The lithography method of claim 19, wherein step 3 comprises controlling the mask stage to move to compensate for Z-directional height, Rx-directional tilt and Ry-directional tilt for the local surface profile of the portion of the substrate within the corresponding one of the exposure fields, wherein:
　　controlling the mask stage to move to compensate for Z-directional height comprises:
　　defining a value $RS.Z_{set\_i}$ for a Z-directional movement of the mask stage at a start point of each of the exposure fields as:

$$RS.Z_{set\_i} = RS.Z_{ref\_i} + 1/N^{2} * (FLS.Z_i - BF\_Die.Z) \otimes WSF;$$
and defining a value $RS.Z_{set\_i}$ for the Z-directional movement of the mask stage during scanning exposure as:

$$RS.Z_{set\_i} = RS.Z_{ref\_i} + 1/N^{2} * (FLS.Z_i - FLS.Z_{i-1}) \otimes WSF,$$

wherein, $RS.Z_{ref\_i}$ represents a preset Z-directional value for a movement of the mask stage towards a reference object plane during the scanning exposure; $FLS.Z_i$ represents a Z-directional height value measured out by the vertical measurement sensor in a current sampling cycle; $FLS.Z_{i-1}$ represents a Z-directional height value measured out by the vertical measurement sensor in a previous sampling cycle; BF_Die.Z represents a Z-directional height value of the optimum focal plane; N represents a magnification of a first objective lens; and WSF represents a filtering parameter;
controlling the mask stage to move to compensate for an Rx-directional tilt value $RS.Rx_{set\_i}$ comprises:
defining an Rx-directional tilt value $RS.Rx_{set\_i}$ of the mask stage at the start point of each of the exposure fields as:

$$RS.Rx_{set\_i} = RS.Rx_{ref\_i} + 1/N * (FLS.Rx_i - BF\_Die.Rx) \otimes WSF;$$ and defining an Rx-directional tilt value $RS.Rx_{set\_i}$ of the mask stage during scanning exposure as:

$$RS.Rx_{set\_i} = RS.Rx_{ref\_i} + 1/N * (FLS.Rx_i - FLS.Rx_{i-1}) \otimes WSF,$$

wherein, $RS.Rx_{ref\_i}$ represents a preset Rx-directional tilt value for the movement of the mask stage towards the reference object plane during the scanning exposure; $FLS.Rx_i$ represents an Rx-directional tilt value measured out by the vertical measurement sensor in the current sampling cycle; $FLS.Rx_{i-1}$ represents an Rx-directional tilt value measured out by the vertical measurement sensor in the previous sampling cycle; and BF_Die.Rx represents an Rx-directional tilt value of the optimum focal plane;
controlling the mask stage to move to compensate for an Ry-directional tilt value $RS.Ry_{set\_i}$ comprises:
defining an Rx-directional tilt value $RS.Ry_{set\_i}$ of the mask stage at the start point of each of the exposure fields as:

$$RS.Ry_{set\_i} = RS.Ry_{ref\_i} + 1/N * (FLS.Ry_i - BF\_Die.Ry) \otimes WSF;$$ and defining an Ry-directional tilt value $RS.Ry_{set\_1}$ of the mask stage during scanning exposure as:

$$RS.Ry_{set\_i} = RS.Ry_{ref\_i} + 1/N * (FLS.Ry_i - FLS.Ry_{i-1}) \otimes WSF,$$

wherein, $RS.Ry_{ref\_i}$ represents a preset Ry-directional tilt value for the movement of the mask stage towards the reference object plane during the scanning exposure; $FLS.Ry_i$ represents an Ry-directional tilt value measured out by the vertical measurement sensor in the current sampling cycle; $FLS.Ry_{i-1}$ represents an Ry-directional tilt value measured out by the vertical measurement sensor in the previous sampling cycle; and BF_Die.Ry represents an Ry-directional tilt value of the optimum focal plane.

* * * * *